(12) United States Patent
Yu et al.

(10) Patent No.: US 9,230,863 B2
(45) Date of Patent: Jan. 5, 2016

(54) METHOD FOR PRODUCING INTEGRATED CIRCUIT WITH SMALLER GRAINS OF TUNGSTEN

(71) Applicant: GLOBALFOUNDRIES, Inc., Grand Cayman (KY)

(72) Inventors: Jialin Yu, Malta, NY (US); Huang Liu, Mechanicville, NY (US); Jilin Xia, Malta, NY (US); Girish Bohra, Malta, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 5 days.

(21) Appl. No.: 14/177,854

(22) Filed: Feb. 11, 2014

(65) Prior Publication Data

US 2015/0228543 A1    Aug. 13, 2015

(51) Int. Cl.
*H01L 21/4763* (2006.01)
*H01L 21/8234* (2006.01)
*H01L 29/66* (2006.01)

(52) U.S. Cl.
CPC ....... *H01L 21/823437* (2013.01); *H01L 21/823475* (2013.01); *H01L 29/66545* (2013.01)

(58) Field of Classification Search
CPC .............. H01L 21/30655; H01L 21/76879; H01L 29/66545; H01L 23/5226
See application file for complete search history.

(56) References Cited

U.S. PATENT DOCUMENTS

| 2008/0003797 A1* | 1/2008 | Kim ............................. 438/597 |
| 2010/0144140 A1* | 6/2010 | Chandrashekar et al. .... 438/669 |
| 2014/0367801 A1* | 12/2014 | Liu et al. ...................... 257/407 |

* cited by examiner

*Primary Examiner* — Hoai V Pham
(74) *Attorney, Agent, or Firm* — Ingrassia Fisher & Lorenz, P.C.

(57) ABSTRACT

Integrated circuits with tungsten components having a smooth surface and methods for producing such integrated circuits are provided. A method of producing the integrated circuits includes forming a nucleation layer overlying a substrate and within a cavity, where the nucleation layer includes tungsten. A nucleation layer thickness is reduced, and a fill layer if formed overlying the nucleation layer.

19 Claims, 7 Drawing Sheets

METHOD FOR PRODUCING INTEGRATED CIRCUIT WITH SMALLER GRAINS OF TUNGSTEN

TECHNICAL FIELD

The technical field generally relates to integrated circuits and methods for producing integrated circuits, and more particularly relates to integrated circuits with tungsten components having smooth surfaces and methods for producing such integrated circuits.

BACKGROUND

Integrated circuits utilize tungsten components as a conductive material for several different types of structures, such as transistor gates and contacts. Tungsten is typically formed by depositing a nucleation layer, and then depositing additional tungsten over the nucleation layer. The tungsten crystallizes to form a plurality of grains in the nucleation layer, and the additional tungsten grows and expands on the grains from the nucleation layer. The grains rapidly fill narrow cavities, but the fill process is much slower for wide cavities where the grains do not grow together from opposite sides. Continuing the tungsten deposition process to fill the wide cavities produces excessive overburden for the narrow cavities.

Excess deposited tungsten is typically removed by chemical mechanical planarization, and tungsten in the wide cavities is removed more rapidly than in the narrow cavities because it is more accessible to the planarization process. To further complicate the matter, the tungsten may be etched following the planarization process, and the tungsten etch rate in the wide cavities is faster than the tungsten etch rate in the narrow cavities. In some examples, 30% of manufactured integrated circuits suffer from over-etching due to large tungsten losses in wide cavities. The tungsten grains produce a rough surface, similar to sand paper, with different grains extending to different heights at the surface. The planarization process can impact individual grains and break them loose from the tungsten material, so gaps are formed. The removed grain then exposes the sides of adjacent grains to increased abrasive action, so large sections of tungsten are often removed during the planarization process.

Accordingly, it is desirable to provide integrated circuits with tungsten components having smaller grains and a smoother surface and methods for producing such integrated circuits, such that there are fewer gaps from tungsten grains removed during planarization. In addition, it is desirable to provide methods for producing integrated circuits with smaller grains of tungsten so the tungsten is deposited at a more consistent rate in wide and narrow channels. Furthermore, other desirable features and characteristics of the present embodiment will become apparent from the subsequent detailed description and the appended claims, taken in conjunction with the accompanying drawings and this background of the invention.

BRIEF SUMMARY

Integrated circuits and methods for producing the same are provided. In an exemplary embodiment, a method for producing an integrated circuit includes forming a nucleation layer overlying a substrate and within a cavity, where the nucleation layer includes tungsten. A nucleation layer thickness is reduced, and a fill layer if formed overlying the nucleation layer.

In another embodiment, a method is provided for producing an integrated circuit. A nucleation layer including tungsten is formed in a cavity, where the tungsten forms a tungsten grain. The tungsten grain is trimmed to produce a trimmed nucleation grain, and a transistor replacement metal gate is formed with a tungsten fill layer overlying the nucleation layer.

An integrated circuit is provided in another embodiment. The integrated circuit includes a semiconductor substrate with a conductive component overlying the substrate. The conductive component includes a fill layer of tungsten with a fill layer surface. The fill layer surface has a roughness measured by a fill layer surface root mean square based on a fill layer surface height, and the fill layer surface root mean square is no more than about 1.0 nanometers.

BRIEF DESCRIPTION OF THE DRAWINGS

The present embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

An integrated circuit often includes a conductive component made from tungsten. In an exemplary embodiment, the conductive component is a replacement metal gate for a transistor, but many other conductive components are also possible. A dummy gate is removed from over a substrate to produce a cavity, and a work function stack is formed in the cavity in a typical manner. A tungsten nucleation layer is then deposited overlying the work function stack, where the nucleation layer forms a plurality of tungsten grains. The tungsten grains are then trimmed to produce smaller grains, which are referred to herein as trimmed nucleation grains. The trimming process utilizes a conformal plasma etch that is selective to tungsten over underlying materials, such as titanium nitride present in the work function stack. A fill layer of tungsten is then deposited over the trimmed nucleation grains. The fill layer forms with smaller, more orderly grains, and therefore produces a smoother surface. The fill layer is then leveled by chemical mechanical planarization. The smaller, more orderly grains are leveled more consistently than larger grains, so the resulting surface is smoother and has fewer holes or gaps where grains are completely removed. The smoother surface also has a more consistent height, even when formed in cavities with widely varying widths.

Tungsten is a conductive metal, and as such can be used as a conductive component for many purposes in integrated circuits. In an exemplary embodiment, tungsten is used in a replacement metal gate for a transistor, but tungsten can also be used for contacts that extend through interlayer dielectrics, for interconnect lines, or for other purposes where a conductive metal is desired. The use of tungsten in a replacement metal gate is described herein, but those skilled in the art will recognize that the methods disclosed are applicable to a wide variety of uses of tungsten in semiconductor manufacturing.

Figure 1:
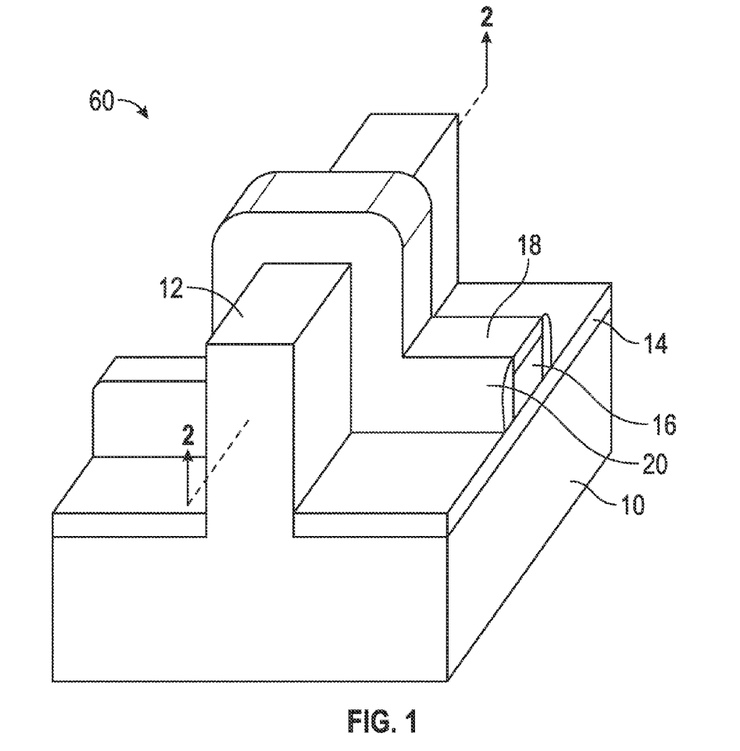
FIG. 1 illustrates a perspective view of an electronic component with a replacement metal gate.
Figure 2:
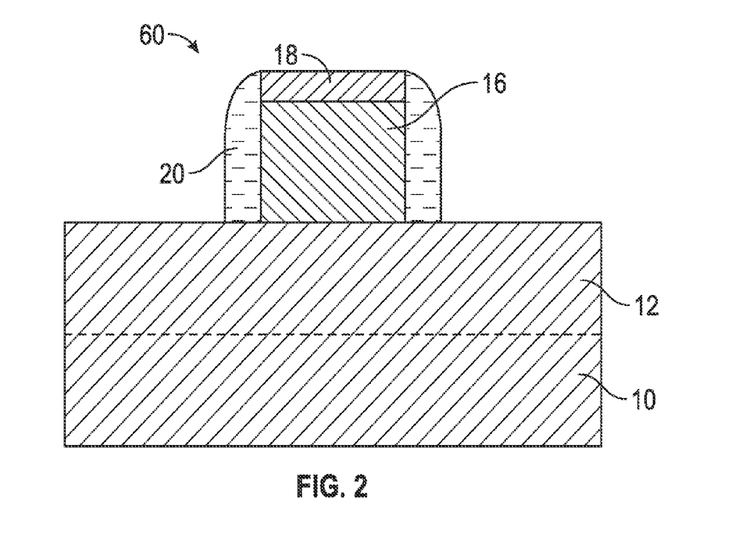
FIG. 2 illustrates a cross sectional view of the electronic component from FIG. 1, taken along line 2-2.

Referring now to FIGS. 1 and 2, a perspective view of a finned field effect transistor (FinFET) of an integrated circuit 60 is illustrated in FIG. 1, and a cross sectional view is illustrated in FIG. 2. A fin 12 extends upward from a semiconductor substrate 10. As used herein, the term "substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. Semiconductor material also includes other materials such as relatively pure and impurity-doped germanium, gallium arsenide, zinc oxide, glass, and the like. In an exemplary embodiment, the semiconductor material is a monocrystalline silicon substrate. The silicon substrate may be a bulk silicon wafer (as illustrated) or may be a thin layer of silicon on an insulating layer (commonly known as silicon-on-insulator or SOI) that, in turn, is supported by a carrier wafer. In an exemplary embodiment, the fin extends from the substrate 10 and is a continuous part of the semiconductor material of the substrate 10, but other embodiments are also possible.

A substrate insulator 14 overlies the substrate 10 adjacent to the fin 12. As used herein, the term "overlying" means "over" such that an intervening layer may lie between the substrate insulator 14 and the substrate 10, and "on" such the substrate insulator 14 physically contacts the substrate 10. The substrate insulator 14 can be silicon oxide, silicon nitride, or a wide variety of insulating materials, and the substrate insulator 14 improves electrical isolation between adjacent fins 12. The manner of forming the substrate 10, fin 12, and substrate insulator 14 are not critical to this invention, and a wide variety of methods can be used as is understood by those skilled in the art.

A dummy gate 16 is formed overlying the fin 12 and substrate 10. In an exemplary embodiment, the dummy gate 16 is formed from polysilicon, such as by low pressure chemical vapor deposition using silane. To form the dummy gate 16, a gate hard mask 18 of silicon nitride is deposited overlying the layer of polysilicon for the dummy gate 16, and a photoresist layer (not shown) is deposited overlying the gate hard mask 18. The photoresist layer (and other photoresist layers described below) are deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations are removed with an organic solvent, and the photoresist remains overlying the other areas. The exposed portions of the gate hard mask 18 are then removed by selective etching, such as with a plasma etch using hydrogen and nitrogen trifluoride or a wet etch with hot phosphoric acid. The dummy gate 16 is formed by removing excess polysilicon from where the photoresist layer and the gate hard mask 18 are removed, such as with a hydrogen bromide plasma with about 3% oxygen.

Gate spacers 20 then are formed on opposite sides of the dummy gate 16, and the gate hard mask 18 is left in place overlying the dummy gate 16. The gate spacers 20 can be formed by blanket depositing silicon nitride followed by an anisotropic etch of the deposited silicon nitride, which leaves the vertical portions adjacent to the dummy gate 16 as the gate spacers 20. Silicon nitride can be deposited by low pressure chemical vapor deposition using ammonia and silane, and a dry plasma etch with hydrogen and nitrogen trifluoride can be used to anisotropically remove the silicon nitride. The silicon nitride anisotropic etch is stopped before the gate hard mask 18 is etched from over the dummy gate 16. The dummy gate 16 extends over the top and along the sides of the fin 12.

Figure 3:
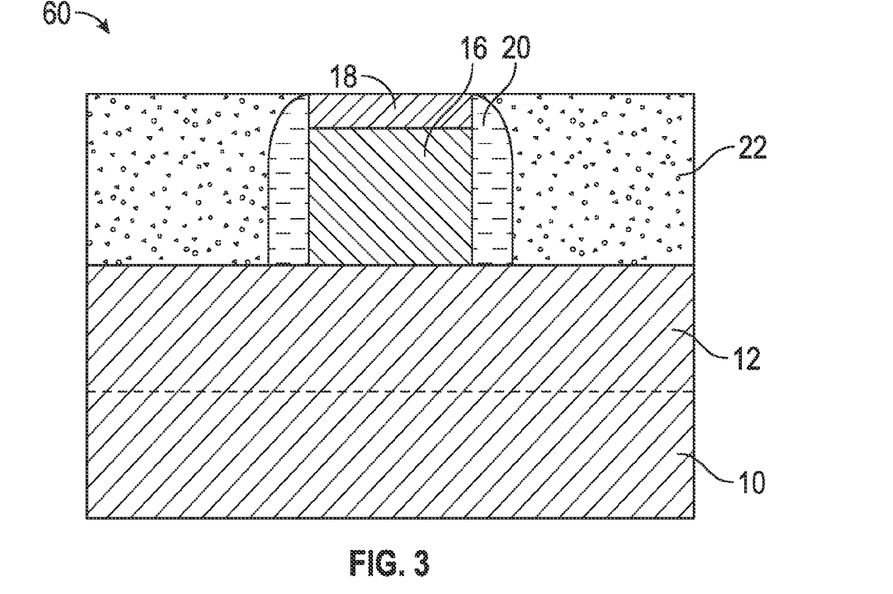
FIGS. 3-8 illustrate, in cross sectional views, a portion of an integrated circuit and methods for its fabrication in accordance with exemplary embodiments.
Figure 4:
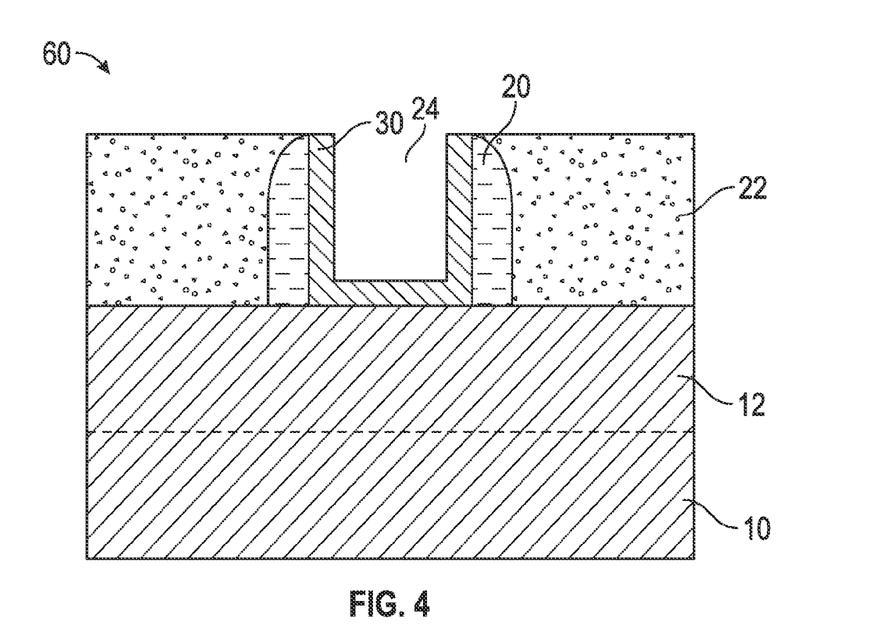

Referring to FIG. 3, in an exemplary embodiment, an interlayer dielectric 22 is deposited overlying the dummy gate 16, the fin 12 and the substrate 10. The interlayer dielectric 22 is formed from, for example, silicon dioxide, which can be deposited by chemical vapor deposition using silane and oxygen. A portion of the interlayer dielectric 22 then is removed, such as by chemical mechanical planarization, to expose the gate hard mask 18. As illustrated in FIG. 4 with continuing reference to FIG. 3, the gate hard mask 18 and the polycrystalline silicon dummy gate 16 are selectively etched to form a cavity 24 between the gate spacers 20. The gate hard mask 18 can be removed with a wet etch using hot phosphoric acid, and the dummy gate 16 can be selectively removed with a hydrogen bromide plasma containing about 3% oxygen.

A work function stack 30 is then formed within the cavity 24. The threshold voltage of the finally completed transistor will depend in some part on the work function stack 30, and there are many variations and options for producing the work function stack 30. In an exemplary embodiment, the work function stack 30 includes a plurality of layers, such as a bottom layer of hafnium oxide and an upper layer of titanium nitride. In alternate embodiments, the work function stack 30 can include layers of tantalum nitride, multiple layers of titanium nitride, polysilicon, and other materials. Hafnium oxide can be deposited by atomic layer deposition using hafnium tetrachloride and water vapor, and titanium nitride can be deposited by physical vapor deposition using sublimed titanium and nitrogen gas at low pressures, such as pressures less than about 30 pascals. One or more of the layers of the work function stack 30 may serve as a gate dielectric for a transistor in some embodiments. Overburden from the work function stack 30 deposition process is removed with chemical mechanical planarization. The cavity 24 is still defined within the work function stack 30, where the cavity 24 is open at the top, that is, and end or region of the cavity 24 furthest from the fin 12.

Figure 5:
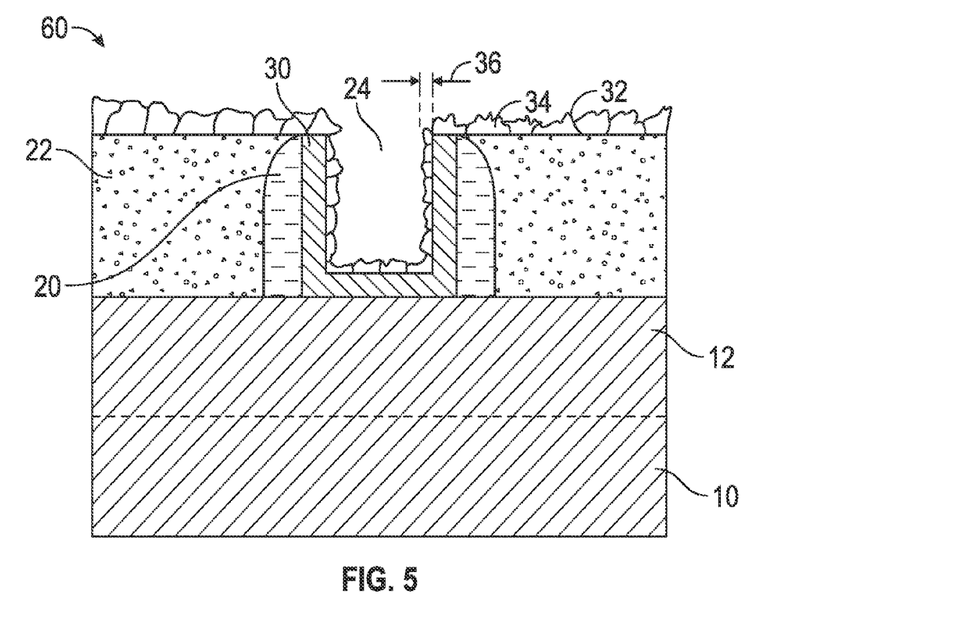

Reference is now made to FIG. 5. The replacement metal gate uses a conductive metal within the work function stack 30, and tungsten is used in an exemplary embodiment. The tungsten is deposited in stages, beginning with a nucleation layer 32. The nucleation layer 32 is formed by a plurality of tungsten grains 34, and the tungsten grains 34 and nucleation layer 32 overlie the work function stack 30. In an exemplary embodiment, tungsten is deposited by chemical vapor deposition using tungsten hexafluoride with hydrogen and diborane, but other deposition techniques are also possible. The nucleation layer 32 is primarily tungsten, but other materials can also be present in some embodiments, such as alloys or dopants. Diborane can be used during the chemical vapor deposition process to slow the deposition rate, which provides better control of the nucleation layer thickness. The nucleation layer 32 is formed within the cavity 24 and overburden forms along the interlayer dielectric 22 and other exposed surfaces.

Figure 6:
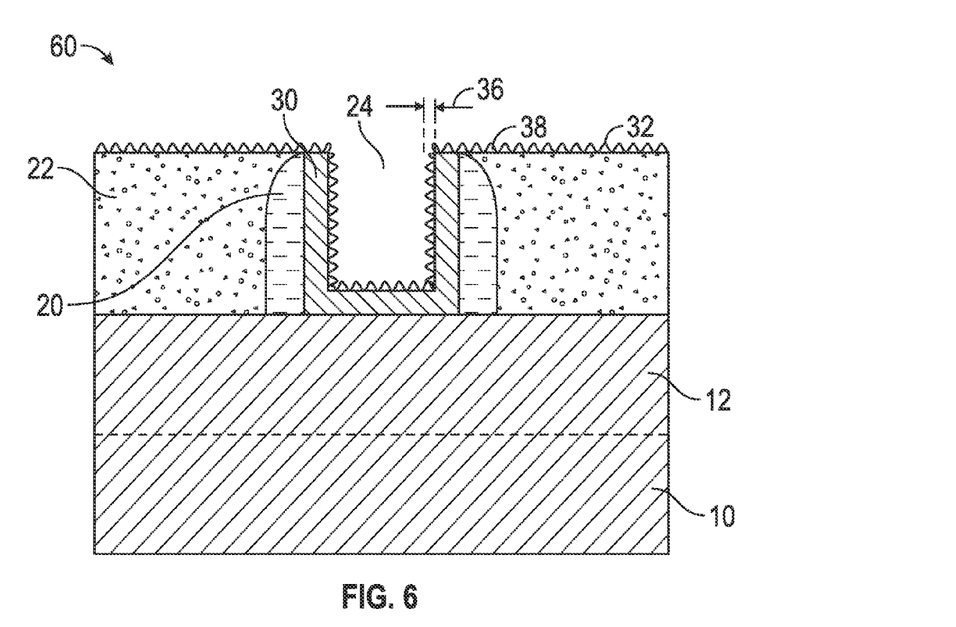

Referring to FIG. 6 with continuing reference to FIG. 5, the tungsten grains 34 are trimmed to form smaller grains of tungsten referred to as trimmed nucleation grains 38. The nucleation layer 32 is originally formed with a nucleation layer thickness 36, indicated by arrows, of less than about 50 angstroms in some embodiments, and less than about 30 angstroms in other embodiments. If the original nucleation layer 32 is too thick, such as a nucleation layer thickness 36 of about 20 nanometers or more, the trimming process is not as effective and provides little to no benefit. The nucleation layer 32 and the tungsten grains 34 are trimmed with a selective conformal etch. The etch is conformal, or isotropic, so vertical side surfaces are etched at about the same rate as horizontal surfaces and the entire nucleation layer thickness 36 is reduced in an essentially consistent manner. The selective etchant can be varied for different materials underlying the nucleation layer 32. A plasma etch using nitrogen trifluoride is used in an exemplary embodiment with titanium nitride underlying the nucleation layer 32, because the nitrogen trifluoride etches tungsten much faster than titanium nitride. In some embodiments, the process of depositing the nucleation layer 32 and trimming the tungsten grains 34 is repeated to develop a more consistent nucleation layer 32.

Figure 7:
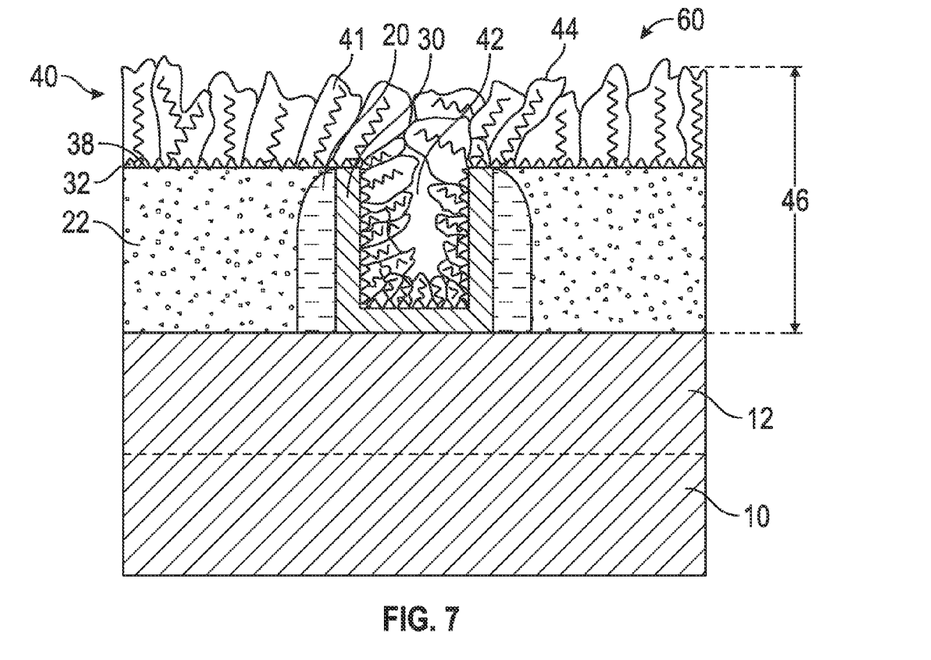

Reference is now made to FIG. 7. A fill layer 40 is formed overlying the nucleation layer 32. In an exemplary embodiment, the fill layer 40 is primarily tungsten, for example 80 percent by mass tungsten or more, and the fill layer 40 forms fill layer grains 41 extending from the trimmed nucleation grains 38. The trimmed nucleation grains 38 are illustrated for clarity, but may actually be incorporated into the fill layer grains 41. The fill layer 40 of tungsten can be deposited by chemical vapor deposition using tungsten hexafluoride and hydrogen or other techniques, and the fill layer 40 is formed in a step-wise manner. For example, the tungsten deposition begins by filling the chemical vapor deposition oven over the work piece with tungsten hexafluoride and hydrogen for a set period of time to deposit a first cycle of tungsten, and then the chemical vapor deposition oven is purged. The deposition process is repeated to gradually fill the cavity 24. In some embodiments, different process conditions are used in the various cycles of the tungsten deposition process. For example, the first cycle may deposit tungsten at a temperature of about 100 degrees centigrade (° C.) less than subsequent cycles, where the deposition temperature generally ranges from about 250° C. to about 450° C.

In some embodiments, the fill layer 40 will "pinch off" over the cavity 24, and form a cavity fill gap 42. The cavity fill gap 42 is undesirable because it reduces the electrical conductivity and/or connectivity of the material within the cavity 24. The fill layer 40 can be etched, such as with an isotropic plasma etch using nitrogen trifluoride, to open the cavity fill gap 42 and allow for additional tungsten deposition to fill the cavity fill gap 42, or at least to reduce it.

The fill layer 40 has a fill layer surface 44 and a fill layer surface height, indicated by double headed arrow 46, where the fill layer surface height 46 is measured from a flat reference layer parallel to the fill layer surface 44. In an exemplary embodiment, the fill layer surface height 46 is measured from the fin 12, and the fill layer surface height 46 varies with the peaks and valleys formed by the fill layer grains 41. The fin 12 has horizontal and vertical surfaces, and the appropriate fin surface is used as the reference for horizontal and vertical fill layer surfaces 44. The fill layer surface 44 has a roughness measured by a fill layer surface root mean square based on the fill layer surface height 46. The larger the differences in height between the peaks and valleys of the fill layer grains 41, the larger the fill layer surface root mean square will be. The fill layer surface root mean square provides an objective method for measuring the roughness of the fill layer surface 44, and experimentation has shown fill layers 40 formed over tungsten grains 34 (after chemical mechanical planarization) that were not trimmed generally have a fill layer surface root mean square of from about 3 to about 5 nanometers, but values as low as about 1.2 nanometers have been observed. Fill layers 40 formed over trimmed nucleation grains 38, using the same fill layer deposition methods and measured after chemical mechanical planarization, have a fill layer surface root mean square of from about 0.5 to about 2 nanometers, and less than about 1.0 nanometer in some embodiments. In some embodiments, the fill layer surface root mean square is less than about 0.7 nanometers. Fill layers 40 formed over trimmed nucleation grains 38 are measurably smoother than fill layers 40 formed over untrimmed tungsten grains 34, and the smoother fill layer surface 44 has fewer holes and gaps. Holes and gaps often break connectivity and result in a malfunctioning integrated circuit, so the trimmed nucleation grains 38 decrease the percentage of failures in an integrated circuit manufacturing process.

Figure 8:
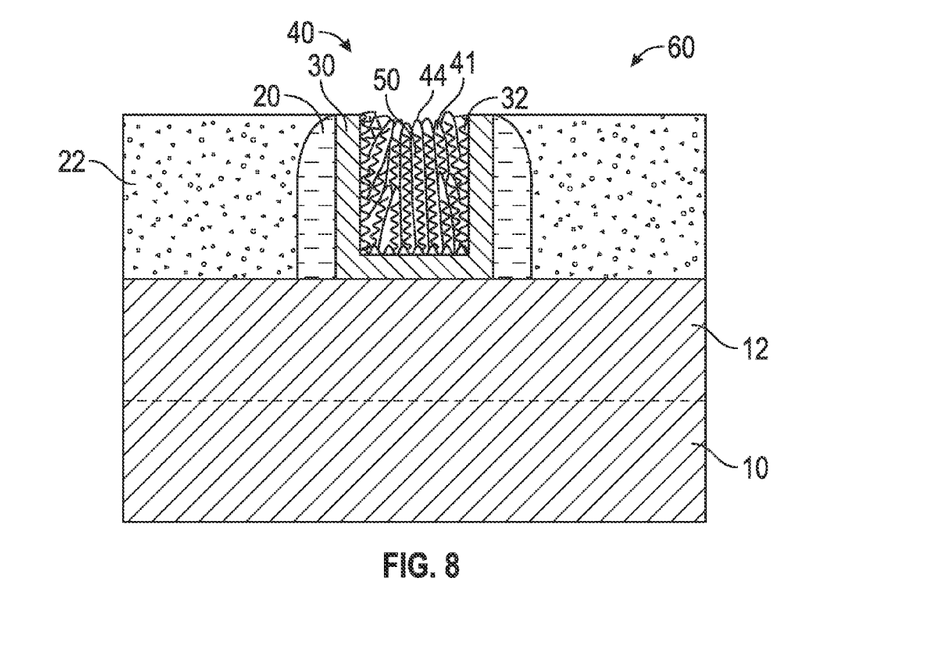

The tungsten overburden is removed, such as by leveling using chemical mechanical planarization, as illustrated in FIG. 8 with continuing reference to FIGS. 6-7, to form replacement metal gate 50. In some embodiments, the top portion of the replacement metal gate 50 is removed (not shown), such as with a reactive ion etch using silicon hexafluoride, and the top portion of the work function stack 30 is also removed by selective etching (not shown). Etchants for the work function stack 30 are selected based on the materials used. For example, if the work function stack 30 includes hafnium oxide and titanium nitride, a wet etch with nitric acid and hydrofluoric acid can be used. Alternatively, a reactive ion etch with silicon hexafluoride or nitrogen trifluoride can be used.

Figure 9A:
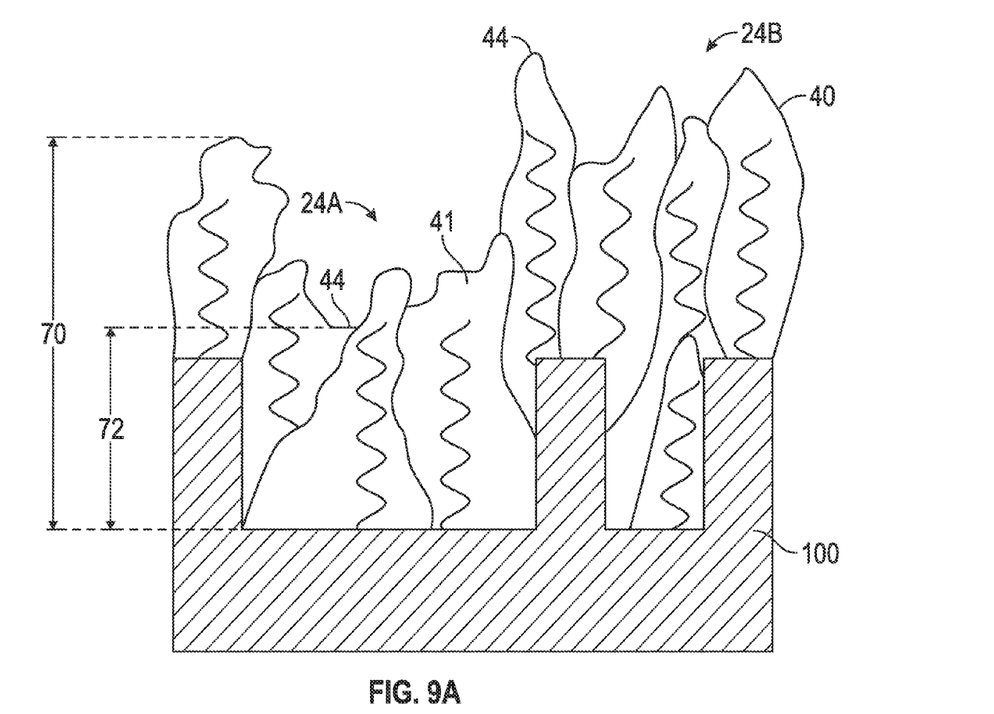
FIGS. 9A through 9D illustrate, in cross sectional views, a portion of an integrated circuit formed without and with trimmed nucleation grains, respectively, to demonstrate the results of the embodiments described herein.
Figure 9B:
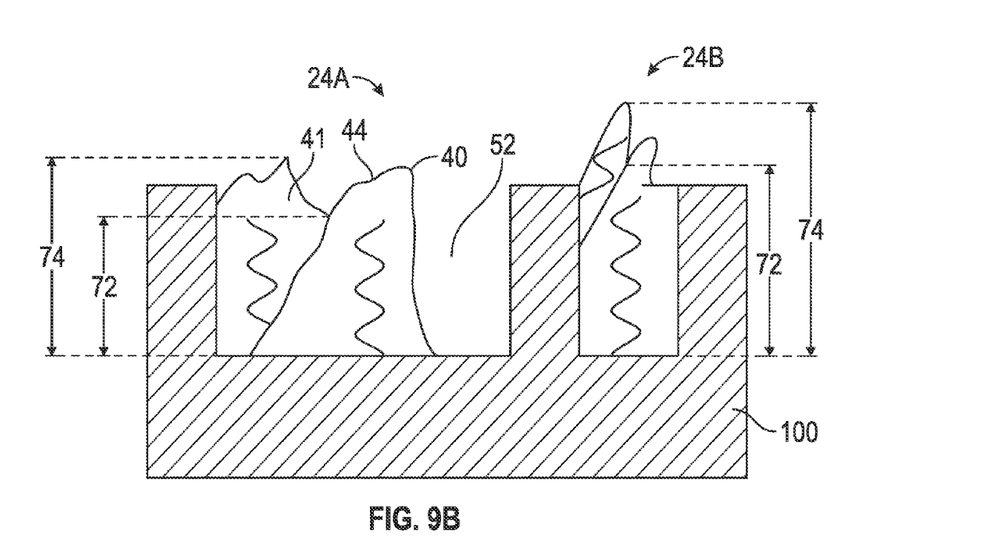
Figure 9C:
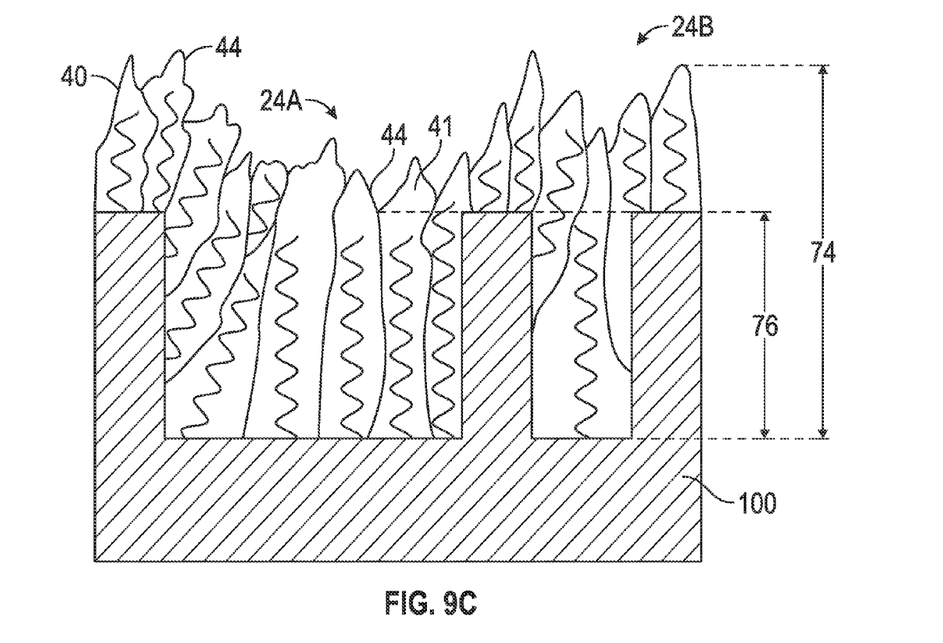
Figure 9D:
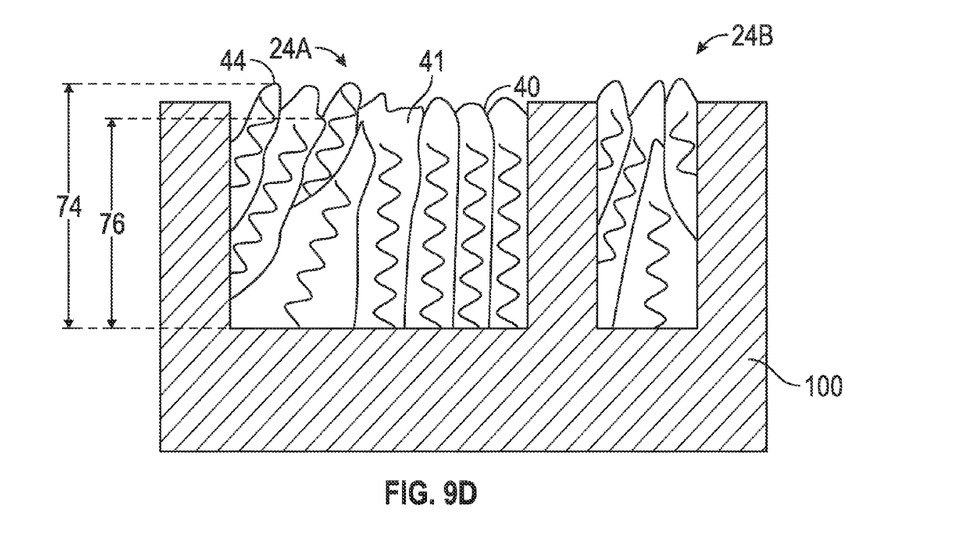

Reference is now made to FIGS. 9A through 9D, with continuing reference to FIGS. 6-8, to illustrate hypothetical differences in the final fill layer 40 when the process described above is used as compared to when the process described above is not used. FIGS. 9A through 9D are not actual images, but illustrate observed results. FIGS. 9A and 9C are before leveling with chemical mechanical planarization, and FIGS. 9B and 9C are after chemical mechanical planarization. FIGS. 9A and 9B illustrate a fill layer 40 with a substrate 10 having a wide cavity 24A and a narrow cavity 24B where the nucleation layer 32 was not trimmed, and FIGS. 9C and 9D illustrate the same substrate 10 where the nucleation layer 32 was trimmed. FIGS. 9A and 9B illustrate a varying fill layer surface height 46 within a cavity 24A, 24B, where the fill layer surface height 46 at the peak of a fill layer grain 41 is higher than at a valley between fill layer grains 41. A hole 52 is shown in the wide cavity 24A where a fill layer grain 41 was completely removed during chemical mechanical planarization, instead of just being leveled. The fill layer surface height 46 before and after chemical mechanical planarization is higher in the narrow cavity 24B than in the wide cavity 24A. FIGS. 9C and 9D illustrate the smaller, more orderly fill layer grains 41 formed from trimmed nucleation grains 38, and the resulting fill layer 40 after leveling by chemical mechanical planarization. FIG. 9D illustrates how the smaller, more orderly fill layer grains 41 are leveled to produce a fill layer surface 44 with small variations in the fill layer surface height 46 within one cavity 24, and a more consistent fill layer surface height 46 between the wide cavity 24A and the narrow cavity 24B. The small variations in the fill layer surface height 46 in FIG. 9D produce a smooth fill layer surface 44 with a smaller fill layer surface root mean square than in FIG. 9B.

The process described herein produces a fill layer 40 with reduced electrical resistivity as well as a smoother surface. Measurements have shown that fill layers 40 formed using the process described herein have lower resistivity than fill layers 40 formed without trimmed nucleation grains 38. The exact reason for the differences in resistivity are not known but presumably the smaller fill layer grains 41 formed from trimmed nucleation grains 38 have lower resistivity than larger fill layer grains 41. Fill layers 40 produced using trimmed nucleation grains 38 have fewer holes 52 than comparable fill layers 40 produced without trimmed nucleation grains 38, and the lack of holes 52 may also contribute to a lower resistivity. The fill layer grains 41 formed from trimmed nucleation grains 38 are more organized, as mentioned above, and generally tend to point upward more so than fill layer grains 41 formed without trimmed nucleation grains 38. The more consistent and organized nature of the fill layer grains 41 may also contribute to the lower resistivity.

Figure 10:
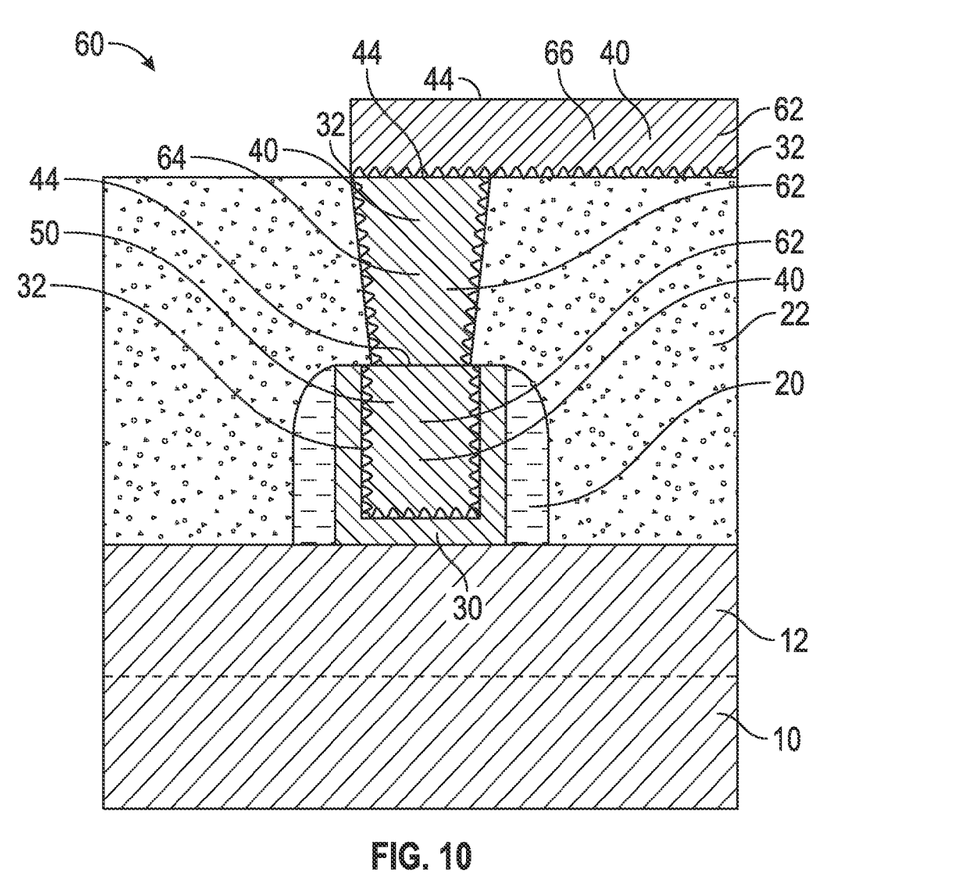
FIG. 10 illustrates a cross sectional view of a portion of an integrated circuit with a plurality of different conductive components.

Reference is now made to FIG. 10, with continuing reference to FIGS. 6-9D. The process described above is used to fill cavities 24 of varying widths with the nucleation layer 32 and the fill layer 40 to a uniform and consistent height. The fill layer 40 and the nucleation layer 32 with trimmed nucleation grains 38 remain in the cavity 24 and form various conductive components 62 within an integrated circuit 60. A partial list of different embodiments of the conductive components 62 include a replacement metal gate 50, a contact 64 extending through an interlayer dielectric 22, or an interconnect 66 electrically connected to a contact 64, where the interconnect 66 electrically connects the replacement metal gate 50 to other electronic components in the integrated circuit 60. The contact 64, interconnect 66, or other conductive component 62 can be formed using the process described above in conjunction with methods and techniques well known to those skilled in the art. In some embodiments, the process for forming the conductive component 62 may not include the use of a cavity 24.

Replacement metal gates 50 or other conductive components 62 formed from trimmed nucleation grains 38 have several benefits, including: (1) more consistent height within one cavity 24; (2) more consistent height from one cavity 24 to the next, especially when the cavities 24 have varying widths; (3) smaller fill layer grains 41 in the fill layer 40; (4) more organized fill layer grains 41 in the fill layer 40, where the fill layer grains 41 generally all point upward; (5) fewer holes 52 where fill layer grains 41 have been pulled out of the fill layer 40; and (6) a lower resistivity for the resulting conductive component 62.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
   forming a nucleation layer overlying a substrate and within a cavity, wherein the nucleation layer comprises tungsten, and wherein the nucleation layer has a nucleation layer thickness;
   reducing the nucleation layer thickness;
   forming a fill layer overlying the nucleation layer; and
   leveling the fill layer by chemical mechanical planarization such that a fill layer surface has a roughness measured by a fill layer surface root mean square based on a fill layer surface height, and wherein the leveled fill layer surface root mean square is no more than about 1.0 nanometers.

2. The method of claim 1 further comprising:
   forming a work function stack within the cavity prior to forming the nucleation layer.

3. The method of claim 1 wherein reducing the nucleation layer thickness further comprises:
   trimming a tungsten grain within the nucleation layer to form a trimmed nucleation grain.

4. The method of claim 3 wherein trimming the tungsten grain further comprises etching the nucleation layer with an etchant, wherein the etchant comprises nitrogen trifluoride.

5. The method of claim 1 wherein forming the nucleation layer overlying the substrate further comprises forming the nucleation layer wherein the nucleation layer thickness is no more than about 5 angstroms.

6. The method of claim 1 further comprising:
   repeating the steps of forming the nucleation layer and reducing the nucleation layer thickness prior to forming the fill layer, such that at least 2 nucleation layers are formed and thinned.

7. The method of claim 1
   wherein forming the fill layer further comprises depositing tungsten on the nucleation layer such that the fill layer pinches off the cavity to form a cavity fill gap; the method further comprising:
   depositing tungsten within the cavity fill gap to fill the cavity fill gap.

8. The method of claim 1 wherein forming the fill layer further comprises depositing tungsten using tungsten hexafluoride in a hydrogen and diborane environment.

9. The method of claim 8 wherein forming the fill layer further comprises depositing tungsten in a plurality of stages in a deposition oven, wherein the tungsten hexafluoride is purged from the deposition oven between each stage.

10. The method of claim 1 wherein forming the fill layer further comprises forming the fill layer wherein the fill layer is about 80 mass percent tungsten or more.

11. A method of producing an integrated circuit comprising:
    forming a nucleation layer in a cavity, wherein the nucleation layer comprises tungsten, and wherein the nucleation layer forms a tungsten grain;
    trimming the tungsten grain to produce a trimmed nucleation grain;
    forming a transistor replacement metal gate with a fill layer overlying the nucleation layer, wherein the fill layer comprises tungsten, and wherein forming the fill layer further comprises depositing tungsten on the nucleation layer such that the fill layer pinches off the cavity to form a cavity fill gap;
    etching the fill layer to expose the cavity fill gap; and
    depositing tungsten within the cavity fill gap.

12. The method of claim 11 wherein trimming the tungsten grain further comprises etching the nucleation layer isotropically with nitrogen trifluoride.

13. The method of claim 11 further comprising:
forming a dummy gate overlying a substrate; and
removing the dummy gate to produce the cavity.

14. The method of claim 11 further comprising:
forming a work function stack within the cavity prior to forming the nucleation layer.

15. The method of claim 11 wherein forming the nucleation layer further comprises forming the nucleation layer with a nucleation layer thickness, wherein the nucleation layer thickness is no more than about 5 angstroms.

16. The method of claim 11 wherein forming the fill layer further comprises depositing tungsten on the nucleation layer, wherein the tungsten is deposited using tungsten hexafluoride in a hydrogen and diborane environment.

17. The method of claim 16 wherein forming the fill layer further comprises filling the cavity with the fill layer in a plurality of deposition stages, wherein the tungsten hexafluoride is purged from over the cavity between the deposition stages.

18. The method of claim 11 wherein
depositing tungsten within the cavity fill gap comprises filling the cavity fill gap.

19. The method of claim 11 further comprising:
leveling a fill layer surface by chemical mechanical planarization, wherein the fill layer surface has a fill layer surface height and a smoothness measured by a fill layer surface root mean square based on the fill layer surface height, and where the fill layer surface root mean square is less than about 1.0 nanometers after leveling.

* * * * *